United States Patent [19]

Kawamura et al.

[11] Patent Number: 4,997,745

[45] Date of Patent: Mar. 5, 1991

[54] PHOTOSENSITIVE COMPOSITION AND PHOTOPOLYMERIZABLE COMPOSITION EMPLOYING THE SAME

[75] Inventors: Kouichi Kawamura; Hirotaka Matsumoto; Jun Yamaguchi, all of Shizuoka, Japan

[73] Assignee: Fuji Photo Film Co., Ltd., Kanagawa, Japan

[21] Appl. No.: 394,383

[22] Filed: Aug. 11, 1989

[30] Foreign Application Priority Data

Aug. 11, 1988 [JP] Japan .................. 63-200606

[51] Int. Cl.[5] ............................. G03C 1/73; G03F 7/28
[52] U.S. Cl. ................................. 430/281; 430/342; 430/343; 430/915; 430/920; 430/925; 430/926; 430/944; 430/921; 522/16; 522/26
[58] Field of Search ............ 430/281, 343, 342, 920, 430/926, 925, 915, 944, 921; 522/16, 26

[56] References Cited

U.S. PATENT DOCUMENTS

| | | |
|---|---|---|
| 4,505,793 | 3/1985 | Tamoto et al. ............. 204/159.16 |
| 4,774,163 | 9/1988 | Higashi ............................ 430/281 |
| 4,810,618 | 3/1989 | Koike et al. ..................... 430/281 |
| 4,837,128 | 6/1989 | Kawamma et al. ............. 430/281 |
| 4,845,011 | 7/1989 | Wilczak et al. ................. 430/281 |
| 4,859,572 | 8/1989 | Farid et al. ..................... 430/281 |

FOREIGN PATENT DOCUMENTS

| | | |
|---|---|---|
| 3541534 | 5/1987 | Fed. Rep. of Germany . |
| 58-29803 | 2/1983 | Japan . |

*Primary Examiner*—Paul R. Michl
*Assistant Examiner*—Janis L. Dote
*Attorney, Agent, or Firm*—Sughrue, Mion, Zinn, Macpeak & Seas

[57] ABSTRACT

A photosensitive composition comprising a trihalomethyl-s-triazine compound and a photosensitizer, wherein the photosensitizer being a dye having a reduction potential not more than 0.10 volt higher than the reduction potential of the trihalomethyl-s-triazine compound, and a photopolymerizable composition employing the photosensitive composition.

7 Claims, No Drawings

PHOTOSENSITIVE COMPOSITION AND PHOTOPOLYMERIZABLE COMPOSITION EMPLOYING THE SAME

FIELD OF THE INVENTION

This invention relates to a photosensitive composition and a photopolymerizable composition employing the same.

More particularly, the present invention relates to a highly sensitive and color-sensitized photosensitive composition, and also to a photopolymerizable composition employing the photosensitive composition, the compositions employable in preparing lithographic printing plates, resinous letterpress printing plates, a resist pattern or photomask for the production of printed circuit boards, and a black-and-white or colored sheet for transfer color development or a color-developing sheet.

BACKGROUND OF THE INVENTION

Various photographic image-forming systems are known wherein the formation of images is accomplished by means of curable organic components having an ethylenically unsaturated group. Due to the presence of an ethylenically unsaturated group, the organic components undergo an imagewise light-induced addition reaction, which typically comprises either polymerization or crosslinking, and curing to form corresponding images.

Another known photographic image-forming system employs a combination of a leuco dye, which generates a color upon oxidation or reaction with an acid, and a radical generator which functions as an oxidizing agent or an acid. Examples of this type of system are described in Phot. Sci. Eng., 598(1961) and U.S. Pat Nos. 3,042,515 and 3,615,568.

The compositions used in these systems generally employ coinitiators. One of the coinitiators is a photosensitizer, which is thought to capture photons in incident radiation. The other coinitiators is called an activator. An activator is not directly responsive to incident radiation, but molecules of the activator interact with adjacent photosensitizer molecules excited by the capture of photons, and then the activator emits free radicals. In the case where a compound having ethylenically unsaturated groups is present, the free radicals thus emitted induce an addition reaction. Where a leuco dye is present, the free radicals induce a reaction of the leuco dye, whereby a color is either generated or disappears on the dye.

Various combinations of a photosensitizer and an activator, which function as described above, are known. A particularly useful activator is an s-triazine compound having at least one trihalomethyl group (hereinafter referred to as "trihalomethyl-s-triazine") because it is advantageously employed as a photopolymerization initiator for compounds having an unsaturated double bond. The trihalomethyl-s-triazine compound is also advantageously used as a material in photo-printing processes utilizing oxidation of a leuco dye or other dyes, or the reaction of such dyes with an acid. Hence, various combinations of trihalomethyl-s-triazines with photosensitizers have been proposed.

For example, these photosensitizers include the 3-ketocoumarin compounds disclosed in JP-A-58-15503 (corresponding to U.S. Pat. No. 4,505,793), the thiopyrylium slats disclosed in JP-A-58-40302, the naptho-thiazole merocyanine compounds disclosed in JP-B-59-28328 and JP-B-60-53300, and the merocyanine compounds disclosed in JP-B-61-9621, JP-B-62-3842, JP-A-59-89303 (corresponding to U.S. Pat No. 4,481,276) and JP-A-60-60104. (The terms "JP-A" and 37 JP-B" as used herein mean an "unexamined published Japanese patent application" and an "examined Japanese patent publication", respectively). By use of these photosensitizers, the spectral range in which the trihalomethyl-s-triazine compounds exhibit spectral sensitivity has been extended to the visible range, and especially in the region of light having a wavelength of 550 nm or shorter, wherein some sensitizers may be usefully employed.

However, a photosensitizer useful in the range of light having a wavelength of 550 nm or longer has not yet been developed. In addition, for practical use in the range of light having a wavelength of 550 nm or shorter, a more sensitive photosensitizer has been desired.

SUMMARY OF THE INVENTION

It is, therefore, an object of the present invention to provide a photosensitive composition which is responsive to radiation of wavelength over the visible and near-infrared ranges of the spectrum, and which has good thermal and storage stability.

A second object of the present invention to provide a photopolymerizable composition employing the above photosensitive composition.

The above objectives are accomplished with a photosensitive composition containing a trihalomethyl-s-triazine activator and a specific photosensitizer, and with a photopolymerizable composition employing the photosensitive composition.

DETAILED DESCRIPTION OF THE INVENTION

The present invention is described below in detail.

The photosensitizer for use in the sensitive composition of the present invention is a dye having a reduction potential not more than 0.10 volt higher than the reduction potential of the trihalomethyl-s-triazine activator.

According to the present invention, certain kinds of dyes which have so far been regarded as unuseful as photoradical generators are extremely usefully when employed as photosensitizers for the trihalomethyl-s-triazine activator, since such dyes generate photoradicals upon exposure to radiation of wavelength in the visible and near-infrared ranges (wavelengths of from 400 to 900 nm) of the spectrum.

Specifically, the dye of the present invention for use as the photosensitizer for the trihalomethyl-s-triazine activator is selected from those dyes having a reduction potential which is not more than 0.10 volt higher than the reduction potential of the trihalomethyl-s-triazine activator.

Hithereto, it has been suggested that an amino-substituted photosensitizer containing keto dyes, specifically a ketocoumarin dye and a ketomethylene dye (merocyanine dye), and having a main absorption peak within the range of wavelengths of up to 550 nm, and further showing a relatively high inter-system crossing efficiency, is useful as a coinitiator for combination with a trihalomethyl-s-triazine activator. In contract, according to the present invention, a dye meeting the above described reduction potential requirement has been found to be a very effective photosensitizer when used as a coinitiator in combination with a trihalomethyl-s-triazine activator.

Therefore, a dye meeting the above described reduction potential criteria and which generates a color suitable for the particular image formation can be advantageously employed as a photosensitizer. In general, a subtractive mixture of elementary color dyes is preferably employed as a photosensitizer, and this applies particularly to the case where multi-color images are formed. A subtractive mixture of elementary color dyes has a main peak in one of the blue (400–500 nm), green (500–600 nm) and red (600–700 nm) ranges, and the hues thereof are yellow, magenta and cyan, respectively.

For example, a dye for use as the photosensitizer of the present invention may be selected from the coumarin dyes (excluding ketocoumarin), merostyryl dyes, oxonol dyes and hemioxonol dyes. All the dyes in the above described group contain a keto group in the blue color-absorbing chromophoric groups and are therefore considered to be keto dyes. However, this does not mean that dyes useful as photosensitizers of the present invention are necessarily keto dyes. That is, a keto group is not essential to the chromophoric group of the dye of the present invention. Non-keto dyes for use in the present invention include various dyes such as, for example, non-keto polymethine dyes, anthracene dyes, rhodamine dyes, acridine dyes, aniline dyes and azo dyes. Non-keto polymethine dyes include cyanine, hemicyanide and styryl dyes.

According to one preferred embodiment of the present invention, a dye sensitizer is selected from the polymethine dyes. Examples of dyes in this group include cyanine, composite cyanine (i.e., tri-, tetra- and polynucleus cyanines), oxonol, hemixonol, styryl, merostyryl and streptocyanine dyes.

In the case of absorption wavelengths not longer than 500 nm, particularly preferred are cyanine dyes (for example, Compounds c and d below) and acridine dyes (for example, Compound f below.)

In the case of absorption wavelengths of 550 nm or more, particularly preferred are cyanine dyes (for example, Compound g below) and cyanine dyes containing an oxyocarbon-bridged nucleus in their methine chain (for example, Compound a below).

The cyanine dye contains two basic heterocyclic nuclei, such as azolinium or azinium nuclei, connected by a methine chain. Examples of the basic heterocyclic nuclei include derivatives of pyridinium, quinolinium, isoquinolinium, oxazolium, thiazolium, selenazolium, indazolium, pyrazolium, pyrrolium, indolium, 3H-indolium, imidazolium, oxadiazolium, benzoxazolium, benzoselenazolium, benzotellurazolium, benzimidazolium, 3H- or 1H-benzoindolium, naphthoxazolium, naphthoselenazolium, napthotellurazolium, carbazolium, pyrrolopyridinium and phenanthrothiazolium quaternary salt.

Examples of the basic heterocyclic nuclei are represented by the following formulae (1) and (2).

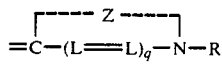 (1)

-continued

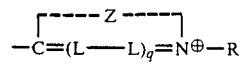

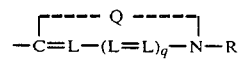 (2)

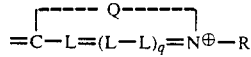

In the above formulae, Z represents the atomic members necessary to form a cyclic nucleus containing at least one atom selected from the group consisting of carbon, nitrogen, sulfur, oxygen and selenium atoms, which derived from a basic nitrogen-containing heterocyclic compound, wherein the cyclic nucleus is a 5- or 6-membered ring or condensed ring consisting of 5- and/or 6-menbered rings. Examples of the nitrogen-containing compound are oxazoline, oxazole, benzoxazole, naphtoxazole (for example, naphtho[2,1-d]oxazole, naphto[2,3-d]oxazole, naphto[1,2-d]oxazole), oxadiazole, thiazoline, thiazoloquinoline (for example, thiazolo[4,5-d]quinoline), thiadioxazole, selenazoline, selenazole, benzoselenazole, naphthoselenazole (for example, naphtho[1,2-d]selenazole), benzotellurazole, naphthotellurazole (for example, naphtho[1,2-d]tellurazole), imidazoline, imidazole, benzimidazole, naphthoimidazole (for example, naphtho[2,3-d]imidazole), 2- or 4-pyridine, 2- or 4-quinoline, 1- or 3-isoquinoline, benzoquinoline, 3H-indole, 1H- or 3H-benzoindole, and pyrazole. The nuclei of these compounds may be substituted by one or more substituent group, examples of which include a hydroxyl group, a halogen atom (fluorine, chlorine, bromine, iodine), a substituted or unsubstituted alkyl group (for example, methyl, ethyl, propyl, isopropyl, butyl, octyl, dodecyl, octadecyl, 2-hydroxyethyl, 3-sulfopropyl, carboxymethyl, 2-cyanoethyl, trifluoromethyl), a substituted or unsubstituted aryl group (for example, phenyl, 1-naphthyl, 2-naphthyl, 4-sulfophenyl, 3-carboxyphenyl, 4-biphenyl), an aralkyl group (for example, benzyl, phenethyl), an alkoxy group (for example, methoxy, ethoxy, isopropoxy, an aryloxy group (for example, phenoxy, 1-naphthoxy), an alkylthio group (for example, methylthio, ethylthio), an arylthio group (for example, phenylthio, p-tolylthio, 2-naphthylthio), a methylenedioxy group, a cyano group, a 2-thienyl group, a styryl group, an amino group, a substituted amino group (for example, anilino, dimethylamino, diethylamino, morpholino), and an acyl group (for example, formyl, acetyl, benzoyl, benzenesulfonyl).

In the above formulae, Q represents the atomic members necessary to form a cyclic nucleus containing at least one atom selected from the group consisting of carbon, nitrogen, sulfur, oxygen and selenium atoms, which derived from a basic nitrogen-containing heterocyclic compound, wherein the cyclic nucleus is a 5- or 6-membered ring or condensed ring consisting of 5- and/or 6-menbered rings. Examples of the nitrogen-containing compound include, such as, pyrrole, indole, carbazole, benzindole, pyrazole, indazole or pyrrolopyridine.

R represents an alkyl group having preferably 1 to 20 carbon atoms, an aryl group having preferably 6 to 20 carbon atoms, an alkenyl group having preferably 2 to 20 carbon atoms or an aralkyl group having preferably 7 to 20 carbon atoms which may be unsubstituted or substituted by a substituent, including, for example, carboxyl, hydroxyl, sulfo, alkoxyl, sulfato, thiosulfato, phosphono, chlorine, bromine.

L represents a substituted or unsubstituted methine group represented, for example, by $-CR^1=$, where in $R^1$ is hydrogen for a unsubstituted methine group, and in the case where the methine group is substituted, $R^1$ represents an alkyl group having from 1 to 4 carbon atoms or a phenyl group.

Further the symbol q in the above formulae is 0 or 1.

The cyanine dye may contain two heterocyclic nuclei of formula (1) connected to each other by a methine chain consisting of an odd number of methine groups, or may contain two heterocyclic nuclei respectively represented by formula (1) and formula (2) and connected to each other by a methine chain consisting of an even number of methine groups. The methine group may be of the structure $-CR^1=$ as described above. In general, the larger the number of methine groups connecting the nuclei in a polymethine dye, particularly in a cyanine dye, the longer the wavelength of the light absorbed by the dye. For example, the wavelength of light absorbed by a dicarbocyanine dye (i.e., a cyanine dye containing five methine groups connecting two basic heterocyclic nuclei) is longer than that for a carbocyanine dye (i.e., a cyanine dye containing three methine groups connecting two basic heterocyclic nuclei) and the latter absorbs light of a longer wavelength than a simple cyanine dye (i.e., a cyanine dye containing a single methine group connecting two basic heterocyclic nuclei). The carbocyanine dye and the dicarbocyanine dye are long-wavelength dyes. The simple cyanine dye is representative of a yellow dye, but its absorption maximum can be shifted to a wavelength of about 550 nm by appropriately selecting nuclei or other substituents or components of the dye which can bathochromatically shift the absorption maxima.

A generally employed technique for bathochromatically shifting the absorption maxima of polymethine dyes, especially that of the cyanine dyes, is to incorporate an oxocarbon-bridged nucleus in the methine chain. An example of such an oxocarbon-bridged nucleus may take either of the forms represented by the formula (3):

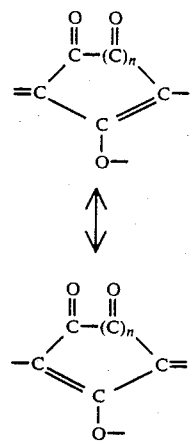

(3)

wherein n is 0, 1 or 2.

The hemicyanine dye has a structure wherein one of the two basic heterocyclic nuclei as in the above-described cyanine dye is bonded to a tertiary amino nucleus through a methine chain having a structure as described above (provided that the number of methine groups contained therein is 0, 2 or a larger even number). In a zero-methine dye, i.e., a dye wherein the chain connecting the nuclei contains no methine group, the two nuclei are bonded to each other through a double bond in one resonance structure, but through a single bond in the other resonance structure. In either resonance structure, however, the position in each nucleus at which the two nuclei are connected is occupied by a methine group constituting part of the nucleus. Zero-methine polymethine dyes are yellow dyes.

An example of the above-described tertiary amino nucleus is represented by the following formula (4).

(4)

In formula (4), $G^3$ and $G^4$ may be the same or different and each represents a substituted or unsubstituted alkyl group having preferably 1 to 20 carbon atoms, a substituted or unsubstituted aryl group having preferably 6 to 20 carbon atoms, or an aralkyl group having preferably 7 to 20 carbon atoms, selected from the substituent groups for the nuclei of formula (1) as given above. Alternatively, $G^3$ and $G^4$ may be bonded together to form a ring derived from a cyclic secondary amine such as pyrrolidine, 3-pyrroline, piperidine, piperazine, piperazine derivatives (for example, 4-methylpiperazine, 4-phenylpiperazine), morpholine, 1,2,3,4-tetrahydroquinoline, decahydroquinoline, 3-aza-bicyclo[3,2,2]nonane, indoline, azetidine or hexahydroazepine.

The above descriptions of the cyanine dyes and hemicyanine dyes describe useful polymethine dyes of relatively simple structure. It is generally thought that an additional ring structure can be formed by introducing further substituent groups in the nuclei and the methine chains. Furthermore, each of the above-mentioned dyes can contain three or more nuclei.

Moreover, it is possible, by modifying various substituent groups other than those included in the chromophoric group, to change the physical properties of the dye, especially the hydrophobic or hydrophilic nature thereof, such that the dye is compatible for use with a particular film-forming component (mainly, binders and monomers). For example, a dye can be made more hydrophobic by selecting a hydrocarbon group having a relatively large number of carbon atoms (for example, about 6 to 20 carbon atoms) as an aliphatic moiety of the dye, while a hydrocarbon group having a small number of carbon atoms (for example, 1 to 5 carbon atoms) or, especially, a hydrocarbon group having a polar substituent group makes the dye more hydrophilic. An aromatic moiety of a dye typically contains 6 to 10 carbon atoms.

The cyanine dyes which can be used in the present invention can be synthesized by known methods as described, for example, in F. M. Hamer, *The Cyanine Dyes and Related Compounds*, Interscience, New York (1964).

According to another preferred embodiment of the present invention, a dye for use as the photosensitizer is selected from the acridine dyes. The acridine dyes are represented by the following formula (5).

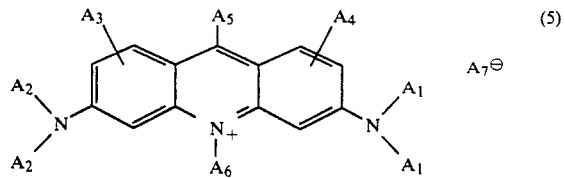

(5)

In formula (5), $A^1$ and $A^2$ are the same or different and each represents hydrogen or an alkyl group having preferably 1 to 6 carbon atoms which may be unsubstituted (such as methyl, ethyl) or substituted by one or more substituents (e.g., a carboalkoxy group, an alkoxy group, a carboxy group, a halogen atom or an aryl group); $A^3$ and $A^4$ are the same or different and each represents hydrogen, a halogen atom (such as chlorine, or bromine), or an alkyl group having preferably 1 to 6 carbon atoms which may be unsubstituted (such as methyl or substituted by one or more substituents (e.g., a carboalkoxy group, an alkoxy group, a carboxy group, a halogen atom or an aryl group); $A^5$ represents hydrogen, an alkyl group having preferably 1 to 6 carbon atoms which may be unsubstituted (such as methyl, ethyl) or substituted by one or more substituents (e.g., a halogen atom, an alkoxy group, a carboalkoxy group or a carboxy group), or a subsituted or unsubstituted aryl group (such as phenyl, p-aminophenyl); $A^6$ represents hydrogen or an alkyl group having preferably 1 to 20 carbon atoms and $A^{7\ominus}$ represents an anion such as a halogen (e.g., $Cl^\ominus$, $Br^\ominus$, $I^\ominus$), perchlorate ($ClO_4^\ominus$), *tetra-fluoroborate* ($BF_4^\ominus$) *or tocylate*

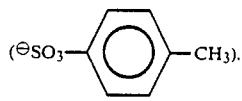

According to a further preferred embodiment of the present invention, a dye for use as the photosensitizer is selected from the sulfonocoumarin dyes. The sulfonocoumarin dyes are represented by the following formula (6).

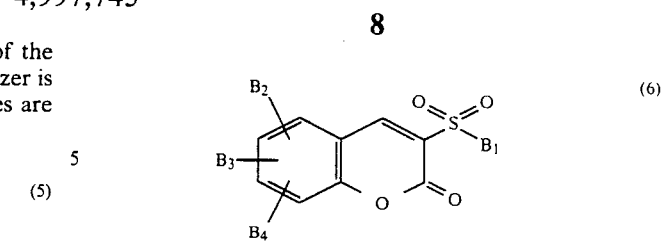

(6)

In formula (6), $B^1$ represents a $C_1$-$C_{12}$ alkyl or alkenyl group, an aryl group having a ring structure containing about 5 to 20 carbon atoms and a hetero-atom, or a heterocyclic ring. $B^2$, $B^3$ and $B^4$ may be the same or different and each represents hydrogen, an alkyl group having 1 to 5 carbon atoms (such as methyl, ethyl), a mono or dialkylamino group (such as methylamino, dimethylamini, diethylamino), an alkoxy group (such as methoxy, ethoxy, n-propoxy), an acyloxy group (such as acetoxyl), an alkoxycarbonyl group, an aryl group having 6 to 10 carbon atoms, a hydroxyl group, or a heterocyclic ring (such as pyridyl, pyrrolinyl, pyrrolidyl). Alternatively, $B^2$, $B^3$ and $B^4$ may each form a heterocyclic ring together with the atoms to which they are bonded.

Although a dye for use as the photosensitizer of the present invention may be selected from the various dyes as described above, the dye selected should show a reduction potential which is lower than or at most 0.10 volt higher than the reduction potential of the trihalomethyl-s-triazine activator for use in combination with the dye, such that the dye is usefully employed as the photosensitizer of the present invention. The transfer of electrons from photosensitizer to an activator is effectively accomplished where the reduction potential of the dye is lower than that of the activator. Further, electron transfer also takes place where the reduction potential of the photosensitizer is equal to that of the activator. Furthermore, even when the reduction potential of the photosensitizer was not more than 0.10 volt higher than that of the activator, effective electron transfer is observed.

For the purpose of selecting a suitable dye, the trihalomethyl-s-triazine compound for use in the present invention is to be compared with dyes in reduction potential. A method for measuring reduction potentials of the compounds of the present invention is described in J. Lenhard, *Measurement of Reversible Electrode Potentials for Cyanine Dyes by the Use of Phase-Selective Second Harmonic Ac Voltammetry*, Journal of Imaging Science, Vol. 30, No. 1, 1967 (January/February).

Non-limiting examples of sensitizers for use in the present invention are given in Table 1 below.

TABLE 1

| Compound No. | Structural Formula | Reduction Potential (V) | λmax (nm) |
|---|---|---|---|
| 1 | (structure shown) | −1.30 | 502 |

TABLE 1-continued
Photosensitizers Listing Reduction Potential and Maximal Absorption Value
| Compound No. | Structural Formula | Reduction Potential (V) | λmax (nm) |
|---|---|---|---|
| 2 | 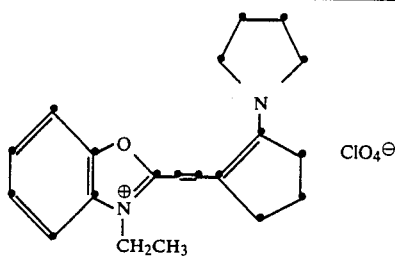 | −1.36 | 484 |
| 3 | 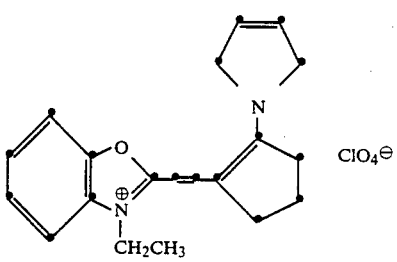 | −1.36 | 485 |
| 4 | 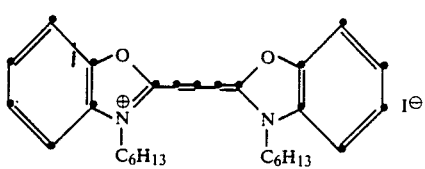 | −1.30 | 499 |
| 5 | 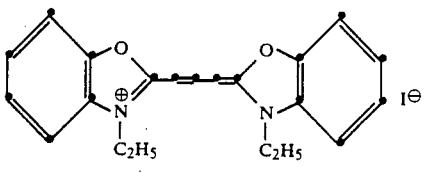 | −1.26 | 499 |
| 6 | 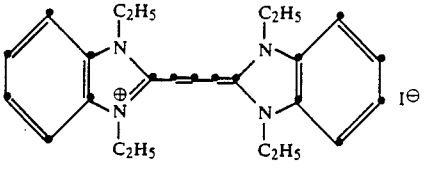 | −1.76 | 504 |
| 7 | 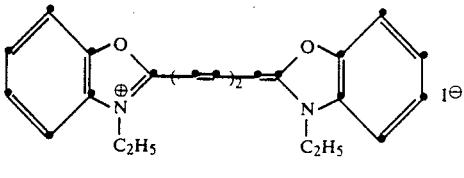 | −1.05 | 592 |
| 8 | 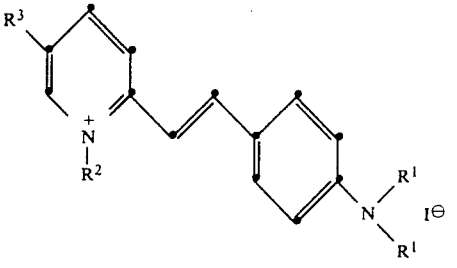 | | |
| | $R^1$ = CH$_3$, $R^2$ = CH$_3$, $R^3$ = H (a) | −1.19 | 468 |
| | $R^1$ = CH$_3$, $R^2$ = CH$_3$, $R^3$ = C$_2$H$_5$ (b) | −1.09 | 462 |

TABLE 1-continued

Photosensitizers Listing Reduction Potential and Maximal Absorption Value

| Compound No. | Structural Formula | | | | Reduction Potential (V) | λmax (nm) |
|---|---|---|---|---|---|---|
| | c | $C_3H_7$ | $CH_3$ | H | −1.23 | 480 |
| | d | $CH_3$ | $C_7H_{15}$ | H | −1.19 | 460 |

9

[Structure: quinolinium–styryl–N,N-dimethylaniline, $I^{\ominus}$, N-$CH_2CH_3$]

Reduction Potential: −0.88 ; λmax: 535

10

[Structure: quinolinium–styryl–benzothiazole, $Cl^{\ominus}$, N-$C_2H_5$ on both]

Reduction Potential: −1.12 ; λmax: 460

11

$R^1-\overset{\oplus}{N}$—(pyridinium)—$(=)_n$—(phenyl)—$NR_2$   $X^{\ominus}$

| | n | $R_1$ | R | $X^{\ominus}$ | | |
|---|---|---|---|---|---|---|
| a | 1 | $CH_3$ | $C_2H_5$ | $I^{\ominus}$ | −1.1 | 494 |
| b | 1 | $(CH_2)_3SO_3^-$ | $C_5H_{11}$ | — | −1.14 | 496 |
| c | 1 | $(CH_2)_4SO_3^-$ | $C_5H_{11}$ | — | −1.14 | 497 |
| d | 2 | $(CH_2)_4SO_3^-$ | $C_5H_{11}$ | — | −1.07 | 508 |

12

[Structure: $(C_2H_5)_2N$–phenyl–CH=C(SO_2R)–C(=O)– ]

| | R | | |
|---|---|---|---|
| a | $C_6H_5$ | −1.4 | 423 |
| b | $CH_3$ | −1.5 | 415 |

13

[Structure: symmetric bis[$R_2N$–phenyl–CH=C–C(=O)–]$SO_2$]

| | R | | |
|---|---|---|---|
| a | $CH_2CH_3$ | −1.4 | 447 |
| b | $CH_2CH_2CH_3$ | −1.4 | 449 |

14

[Structure: $(C_2H_5)_2N$–phenyl–CH=C–C(=O)–$SO_2$–C=CH–(2,5-dimethoxyphenyl with $OCH_3$ groups)]

λmax: 435

TABLE 1-continued

Photosensitizers Listing Reduction Potential and Maximal Absorption Value

| Compound No. | Structural Formula | | | | | | | Reduction Potential (V) | λmax (nm) |
|---|---|---|---|---|---|---|---|---|---|
| 15 | (C$_2$H$_5$)$_2$N-substituted structure with sulfonyl group | | | | | | | | 460 |
| 16 | Bis-sulfonyl structure with HN$^\oplus$(C$_2$H$_5$)$_3$ and O$^\ominus$ | | | | | | | −1.5 | 453 |
| 17 | Triarylmethane structure with R$^1$–R$^6$ substituents and X$^\ominus$ | | | | | | | | |
| | | R$^1$ | R$^2$ | R$^3$ | R$^4$ | R$^5$ | R$^6$ | X$^\ominus$ | |
| | a | H | CH$_2$CH$_3$ | H | CH$_3$ | COOCH$_2$CH$_3$ | H | Cl$^\ominus$ | −0.82 | 535 |
| | b | H | CH$_2$CH$_3$ | H | CH$_3$ | COOCH$_2$CH$_3$ | H | BF$_4^\ominus$ | −0.82 | 535 |
| 18 | (CH$_3$)$_2$N-substituted acridinium structure, Cl$^\ominus$ | | | | | | | | 502 |
| 19 | (CH$_3$)$_2$N-substituted acridinium structure with N-C$_{12}$H$_{25}$, Br$^\ominus$ | | | | | | | −1.1 | 503 |

TABLE 1-continued

Photosensitizers Listing Reduction Potential and Maximal Absorption Value

| Compound No. | Structural Formula | Reduction Potential (V) | λmax (nm) |
|---|---|---|---|
| 20 | *[structure: bis-indolenine cyanine with N-CH₃, I⁻ counterion, polymethine chain (CH=)ₙ]* | | |
| | n | | |
| a | 1 | −1.00 | 555 |
| b | 2 | −0.82 | 650 |
| c | 3 | −0.67 | 750 |
| 21 | *[structure: bis-indolenine cyanine with N-C₇H₁₅, I⁻ counterion]* | −1.06 | 558 |
| 22 | *[structure: bis-benzoxazole cyanine with N-C₂H₅, I⁻ counterion]* | −1.05 | 595 |
| 23 | *[structure: bis-quinoline cyanine with N-R, X⁻ counterion]* | | |
| | R | X⁻ | | |
| a | CH₂CH₂C₆H₅ | Br⁻ | −1.04 | 622 |
| b | CH₂CH₃ | Cl⁻ | −1.04 | 621 |
| 24 | *[structure: bis-quinoline pentamethine cyanine with N-C₂H₅, central CH₃, PF₆⁻ counterion]* | | 725 |

TABLE 1-continued

Photosensitizers Listing Reduction Potential and Maximal Absorption Value

| Compound No. | Structural Formula | Reduction Potential (V) | λmax (nm) |
|---|---|---|---|
| 25 | | | 655 |
| 26 | | −0.86 | 722 |
| 27 | | −0.75 | 578 |
| 28 | | −1.05 | 610 |
| 29 | | −0.99 | 648 |
| 30 | | | |

| | $R^1$ | $R^2$ | $R^3$ | | |
|---|---|---|---|---|---|
| a | $CH_3$ | $CH_3$ | — | −1.15 | 642 |
| b | $CH_3$ | $CH_3$ | — | −1.08 | 673 |

TABLE 1-continued

Photosensitizers Listing Reduction Potential and Maximal Absorption Value

| Compound No. | Structural Formula | | | Reduction Potential (V) | λmax (nm) |
|---|---|---|---|---|---|
| | c | CH$_3$ | C$_6$H$_5$ — | −0.98 | 652 |
| | d | CH$_3$ | −CH$_2$−C$_6$H$_4$−C$_2$H$_5$  — | −1.07 | 649 |
| | e | C$_7$H$_{15}$ | C$_7$H$_{15}$ — | −1.14 | 642 |
| 31 | (structure with R groups) | | | | |
| | a | R = C$_6$H$_5$ | | −0.93 | 605 |
| | b | | | −0.88 | 604 |
| 32 | (structure) | | | −0.92 | 675 |
| 33 | (structure) | | | −1.01 | 675 |
| 34 | (structure) | | | −0.8 | 556 |

TABLE 1-continued
Photosensitizers Listing Reduction Potential and Maximal Absorption Value

| Compound No. | Structural Formula | Reduction Potential (V) | λmax (nm) |
|---|---|---|---|
| 35 | (structure shown) | | |
| a | $R^1$=H, $R^2$=$C_2H_5$, $R^3$=$C_2H_5$, $R^4$=H, $R^5$=$COOC_2H_5$, $R^6$=H, $X^\ominus$=$ClO_4^\ominus$ | −0.79 | 566 |
| b | $R^3$,$R^2$=$CH_2CH_2CH_2$, $R^3$,$R^2$=$CH_2CH_2CH_2$, $R^5$=$COO^-$, $R^6$=H, — | −1.11 | 587 |
| c | $R^3$,$R^2$=$CH_2CH_2CH_2$, $R^3$,$R^2$=$CH_2CH_2CH_2$, $R^5$=$SO_3^-$, $R^6$=$SO_3H$, — | −1.01 | 592 |
| 36 | (structure shown) | | 620 |
| 37 | (structure shown) | | |
| a | n=1 | −1.2 | 553 |
| b | n=2 | −1.0 | 656 |

The trihalomethyl-s-triazine for use in the present invention is represented by the following formula

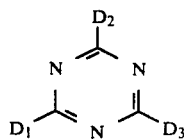
(7)

In formula (7), $D^1$, $D^2$ and $D^3$ each independently represent hydrogen, an alkyl group having preferably 1 to 10 carbon atoms, an aryl group having preferably 6 to 20 carbon atoms, or an alkenyl group having preferably 2 to 20 carbon atoms, and these alkyl, aryl and alkenyl groups may be unsubstituted or substituted by a substituent (e.g., an alkoxy group, a carboalkoxy group, a carboxy group, a halogen atom, a cyano group, an alkyl group, an alkenyl group, an aryl group, an amino group, a dialkyl amono group, an alkylthio group, a halogen atom), provided that at least one of $D^1$, $D^2$ and $D^3$ represents a trihalomethyl group.

Trihalomethyl-s-triazines for use in the present invention may be synthesized according to conventional methods in the art. For example, tri(trichloromethyl)-s-triazine of the formula:

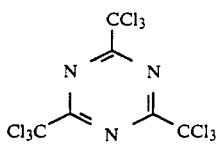

can be synthesized with reference, for example, to *Bull., Chem. Soc. Jpn.* 42,2924(1069);

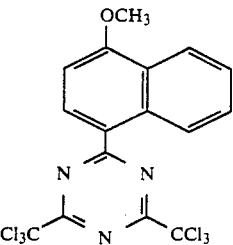

can be synthesized with reference, for example, to West German Patent Application No. 2718259;

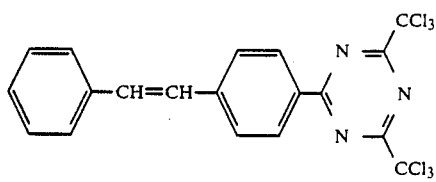

can be synthesized with reference, for example, to U.S. Pat. No. 4,619,998;

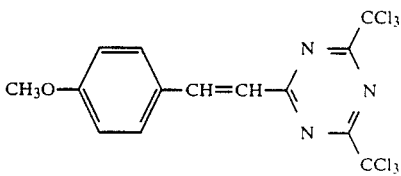

can be synthesized with reference to U.S. Pat. No. 3,987,037;

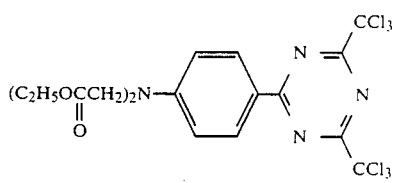

can be synthesized with reference to JP-A-63-58440; and

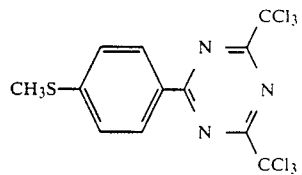

can be synthesized with reference to JP-A-63-146867. However, the trihalomethyl-s-triazine compound for use in the present invention is not be limited to the above noted specific compounds.

In Table 2, examples of the trihalomethyl-s-triazine compound preferably employed in the present invention are listed together with their reduction potentials. The trihalomethyl-s-triazine compound for use in the present invention is not limited to these examples.

TABLE 2

| | Trihalomethyl-s-triazine Compounds | |
|---|---|---|
| | Compound | Ruduction Potential (V) |
| 1 | (structure: 2,4,6-tris(trichloromethyl)-s-triazine) | |
| 2 | (structure: phenyl-bis(trichloromethyl)-s-triazine) | −0.76 |
| 3 | (structure: 4-methoxyphenyl-bis(trichloromethyl)-s-triazine) | −0.78 |

TABLE 2-continued

| | Trihalomethyl-s-triazine Compounds Compound | Ruduction Potential (V) |
|---|---|---|
| 4 | 4-Cl-C6H4 substituted bis(trichloromethyl)triazine | −0.76 |
| 5 | 4-CH3CO-C6H4 substituted bis(trichloromethyl)triazine | −0.76 |
| 6 | 4-CH3OCO-C6H4 substituted bis(trichloromethyl)triazine | −0.75 |
| 7 | 4-NC-C6H4 substituted bis(trichloromethyl)triazine | −0.74 |
| 8 | 1,4-phenylene-bis[bis(trichloromethyl)triazine] | |
| 9 | 4,4'-oxybis(phenylene)-bis[bis(trichloromethyl)triazine] | |

The photosensitive composition comprising a trihalomethyl-s-triazine and a photosensitizer of the present invention can be applied for various image recording materials. Examples of an image recording system of the photosensitive composition are follows.

(1) Forming a cured image by combining the photosensitive composition with ethylenically unsaturated compounds.

(2) Forming a photo-printing image by combining the photosensitive composition with leuco dyes or compounds which can be transit their color under the presence of acid.

(3) Forming a positive image by combining the photosensitive composition with the compounds which can be decomposed by acid.

(4) Forming a cured image by combining the photosensitive composition with epoxy compounds which can be polymerized by the reaction with acid.

In the above system (2), arylamine compounds and arylmethane compounds can be used as the leuco dye. Specific examples of these compounds include diphenylamine, dibenzylaniline, triphenylamine, p,p'-tetramethyldiamino triphenylmethane, p,p',p''-triaminotriphenyl carbinol, etc. As the compound which can be transit their color under presence of acid, triphenylmethane compounds and oxadine compounds can be used. Specific examples of these compounds include ethylviolet, erythrocin B, crystal violet, victoria pure blue, oil blue, etc.

Examples of the composition of the above systems (3) and (4) are described, for example, in U.S. Pat. No. 4,619,998.

The amount of the trihalomethyl-s-triazine compound contained in the photopolymerizable composition of the present invention is preferably in the range of from 0.01 to 60% by weight based on the total amount of ethylenically unsaturated photopolymerizable compounds and organic linear high polymer present in the photopolymerizable composition, if desired. More preferably, the amount of the trihalomethyl-s-triazine compound is from 1 to 30% by weight.

The amount of the photosensitizer contained in the photopolymerizable composition of the present invention is preferably in the range of from 0.01 to 60% by weight based on the total amount of ethylenically unsaturated photopolymerizable compound and organic linear high polymer present in the photopolymerizable composition. More preferably, the amount of the photosensitizer is from 1 to 30% by weight.

The weight ratio of the activator/photosensitizer in this invention is preferably 0.05 to 100, more preferably 0.5 to 10.

The ethylenically unsaturated polymerizable compound contained in the photopolymerizable composition of the present invention is a compound having at least one ethylenically unsaturated bond, and which may be, for example, a monomer or a prepolymer (i.e., dimer, trimer, oligomer), a mixture thereof, or a copolymer thereof. Examples of such a monomer and a copolymer derived therefrom include, for example, an ester of an unsaturated carboxylic acid with an aliphatic polyhydric alcohol compound; and an amide of an aliphatic polyamine compound with an unsaturated carboxylic acid.

Examples of such a monomeric ester of an unsaturated carboxylic acid with an aliphatic polyhydric alcohol compound include, for example, esters of acrylic acid, such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tris(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and bis[p-(acryloxyethoxy)phenyl]dimethylmethane.

Examples of the monomeric esters further include esters of methacrylic acid, such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, and bis[p-(3-methacryloxy-2-hydroxypropoxy)phenyl]dimethylmethane.

Further, examples of the monomeric amide of an aliphatic polyamine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide. Further, examples of the polymeric unsaturated compounds are copolymer of allylmethacrylic acid, copolymer of allylacrylic acid, copoymer of allylglycol methacrylic acid, and copolymer of allylglycol acrylic acid. The amount of the ethylenically unsaturated photopolymerizable compound incorporated into the photopolymerizable composition of the present invention is at least 5% by weight, and preferably is in the range of from 10 to 99.5% by weight, based on the total amount of the components of the photopolymerizable composition.

The above-described novel photosensitive composition or novel photopolymerizable composition containing the photosensitive composition and the ethylenically unsaturated compound is useful in various applications.

For example, a layer containing both the photopolymerizable composition of the present invention and an organic linear high polymer is provided on a support, and the thus-prepared composite structure can be used as a resist for use in the production of printing plates or printed circuit boards with reference to U.S. Pat. Nos. 4,604,342, 4,587,199, 4,629,680, 4,431,723 and 4,550,073 JP-A-61-285444 and JP-A-61-213213; as a color proof material with reference to JP-A-62-67529; as an image-forming material utilizing microcapsules with reference to JP-B-64-7378, JP-A-61-130945 (corresponding to U.S. Pat. No. 4,587,194), JP-A-58-88739 (corresponding to U.S. Pat. Nos. 4,399,209 and 4,822,714), JP-A-58-88740 (corresponding to U.S. Pat. No. 4,440,846) and EP-223587A; and also in many other fields in accordance with methods known in the art.

The present invention is described below with reference to application thereof to lithographic printing plates.

The organic linear high polymer for use in the photopolymerizable composition of the present invention includes organic linear polymers which are compatible with the ethylenically unsaturated polymerizable compound. However, the organic linear high polymer is preferably soluble or swellable in water or in a weakly alkaline aqueous solution to enable development in water or in a weakly alkaline aqueous solution. For example, use a water-soluble organic high polymer allows for development of the photopolymerizable composition with water. Examples of water-soluble organic linear high polymers include addition polymers having a carboxylic acid as a side chain. Such addition polymers include copolymers of methacrylic acid, copolymers of acrylic acid, copolymers of itaconic acid, copolymers of crotonic acid, copolymers of maleic acid, and partly esterified copolymers of maleic acid, as described, for example, in JP-A-59-44615, JP-B-61-61094 (corresponding to U.S. Pat. No. 4,284,707), JP-A-59-53836 (corresponding to U.S. Pat. No. 4,687,727), JP-A-59-71048 (corresponding to U.S. Pat. No. 4,537,855), JP-B-54-34327 (corresponding to U.S. Pat. No. 3,804,631), JP-B-58-12577, and JP-B-54-25957. Additional examples of such organic linear high polymers include acid cellulose derivatives having a carboxylic acid in a side chain. In addition to these, other useful organic linear high polymers include polymers prepared by the addition of a cyclic acid anhydride to an addition polymer having a hydroxyl group. Particularly preferred are a copolymer of benzyl(meth)acrylate, (meth)acrylic acid and, depending on the specific application, other addition-polymerizable vinyl monomers, and a copolymer of allyl(meth)acrylate, (meth)acrylic acid and, depending on the specific application, other addition-polymerizable vinyl monomer.

The organic linear high polymer may be contained in the photopolymerizable composition in an amount of from 0 to 95%, preferably form 0 to 90% based on the total amount of the photopolymerizable composition However, if the proportion of the polymer exceeds 90% by weight of the photopolymerizable composition, the strength of the resulting images is reduced.

Dyes or pigments may be incorporated into the photopolymerizable composition as needed in order to color the composition. The amount of dye or pigment incorporated therein is preferably from about 0.5 to about 5% by weight of the total amount of the components of the photopolymerizable composition. Further, inorganic fillers or other known additives may be incorporated into the photopolymerizable composition in order to improve the physical properties of the cured coatings.

In the case where the photopolymerizable composition of the present invention is applied to a support, a dimensionally stable plate, sheet or film may be used as the support. Examples of the support include, for example, paper, paper laminated with plastic (for example, polyethylene, polypropylene, polystyrene), a metal plate (e.g., aluminum, aluminum alloy, zinc, copper), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonates, polyvinyl acetates), and paper or a plastic film laminated or vapor-deposited with the above-mentioned metals.

Of these supports, an aluminum plate is particularly preferred for preparing photosensitive lithographic printing plates, because an aluminum plate has extremely good dimensional stability and is inexpensive. A composite laminate sheet consisting of a polyethylene terephthalate film and an aluminum sheet, as disclosed in JP-B-48-18327, is also preferably employed.

Where the support of the photopolymerizable composition has a metal surface, especially an aluminum surface, the support preferably has undergone a surface treatment such as sandblasting, immersion in an aqueous solution of, for example, sodium silicate, potassium fluorozirconate or a phosphate, or anodizing.

In order to prevent the inhibition of photopolymerization by oxygen in the air, the layer of the photopolymerizable composition provided on a support may be covered with a protective layer of a polymer, such as polyvinyl alcohol or an acid cellulose, having excellent oxygen barrier properties. Methods of applying such a protective layer are described in detail, for example, in U.S. Pat. No. 3,458,311 and JP-B-55-69729. Alternatively, a derivative of a higher fatty acid, such as behenic acid or behenic acid amide, or the like may be incorporated in the photopolymerizable composition whereby the derivative separates to form a layer of the derivative on the surface of the photosensitive layer, to also act as an oxygen barrier. The amount of the higher fatty acid derivative to be added is preferably from about 0.5 to about 10% by weight of the total amount of the components of the photopolymerizable composition.

The photosensitive material containing the photopolymerizable composition of the present invention is imagewise exposed to light or radiation, and then subjected to development with a developing solution to remove the unexposed portions of the photosensitive layer, to thereby provide an image. Developing solutions preferably employed in the case where the photopolymerizable composition is used in the preparation of lithographic printing plates, are disclosed in JP-B-57-7427. Useful developing solutions include an aqueous solution of an inorganic alkali (such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, sodium carbonate, ammonia water) and an aqueous solution of an organic alkali (such as mono- or diethanolamine). These developing solutions have an alkali concentration of from 0.1 to 10% by weight, and preferably from 0.5 to 5% by weight.

The aqueous alkaline developing solutions may contain small amounts of a surfactant and an organic solvent such as benzyl alcohol, 2-phenoxyethanol or 2-butoxyethanol. Examples of such additives include those described in U.S. Pat. Nos. 3,375,171 and 3,615,480.

The novel photosensitive composition of the present invention employing a photoradical generator is highly responsive to actinic light over a wide wavelength range including the near ultraviolet region, the visible light region, and the near infrared region. Therefore, various lamps can be used as a light source for light exposure, such as a super-high-pressure, medium-pressure or low-pressure mercury lamp, a chemical lamp, a carbon arc lamp, a xenon lamp, a metal halide lamp, various laser lamps emitting visible, ultraviolet and near infrared light, a fluorescent lamp and a tungsten lamp, and further sunlight can also be employed.

The present invention is further illustrated in with reference to the following non-limiting examples.

EXAMPLES 1-8 AND COMPARATIVE EXAMPLE 1

Each of the photosensitive liquid compositions as specified in Table 3 were applied on a 100 μm-thick polyethylene terephthalate support by means of a spinner with a rotational speed of 100 rpm, and then dried at 100° C. for 2 minutes, to thereby form a photosensitive layer on the support.

Subsequently, an aqueous solution of 3 % by weight of polyvinyl alcohol (saponification degree 86.5-89 mol%, polymerization degree 1,000) was applied on the above-obtained photosensitive layers, and then dried at 100° C. for 2 minutes.

The thus-obtained photosensitive materials were tested for photosensitivity as follows.

Each photosensitive material was exposed to light from a 500 W xenon lamp (manufactured by Ushio Electric Inc.) for 100 seconds through a filter (manufactured by Toshiba Glass Co., Ltd., Japan) which does not substantially transmit light of 350 nm or shorter wavelengths.

For the sensitivity evaluation, a Fuji PS step guide (a step tablet manufactured by Fuji Photo Film Co., Ltd., and having 15 steps with an optical transmission density increment of 0.15, the first step having an optical transmission density of 0.05) was employed.

The samples were developed by immersing the light-exposed structures in a developing solution of the following composition at 32° C. for 20 seconds.

| | |
|---|---|
| Sodium carbonate | 10 g |

-continued

| | |
|---|---|
| Butyl cellosolve | 5 g |
| Water | 1 liter |

The sensitivity of each structure was measured by reading the maximum step number of step images remaining after the photocure and development.

The results obtained are shown in Table 3.

Table 3 demonstrates that a useful photo-sensitivity is obtained only when the reduction potential of the photosensitizer is lower than, or at most 0.10 volt higher than the reduction potential of the trihalomethyl-s-triazine compound.

TABLE 3

Photopolymerizable compositions with Reduction Potentials and Results

| | Example | | | | | | | | Comparative Example |
|---|---|---|---|---|---|---|---|---|---|
| | 1 | 2 | 3 | 4 | 5 | 6 | 7 | 8 | 1 |
| Pentaerythritol tetraacrylate (g) | 1.4 | 1.4 | 1.4 | 1.4 | 1.4 | 1.4 | 1.4 | 1.4 | 1.4 |
| Copolymer of benzyl acrylate and Methacrylic acid (molar ratio: 73/27 (g) | 1.3 | 1.3 | 1.3 | 1.3 | 1.3 | 1.3 | 1.3 | 1.3 | 1.3 |
| Trihalomethyl-s-triazine compound | A | B | A | A | A | A | A | A | A |
| (g) | 0.078 | 0.090 | 0.078 | 0.078 | 0.078 | 0.078 | 0.078 | 0.078 | 0.078 |
| Photosensitizer | a | a | b | c | d | e | f | g | h |
| (g) | 0.060 | 0.060 | 0.045 | 0.047 | 0.051 | 0.040 | 0.051 | 0.049 | 0.051 |
| Methyl ethyl ketone (g) | 12 | 12 | 12 | 12 | 12 | 12 | 12 | 12 | 12 |
| Methyl chloride (g) | 6 | 6 | 6 | 6 | 6 | 6 | 6 | 6 | 6 |
| Propylene glycol monomethyl ether acetate (g) | 3 | 3 | 3 | 3 | 3 | 3 | 3 | 3 | 3 |
| Reduction potential of trihalomethyl-s-triazine compound (v) | −0.76 | −0.75 | −0.76 | −0.76 | −0.76 | −0.76 | −0.76 | −0.76 | −0.76 |
| Reduction potential of photosensitizer (v) | −1.15 | −1.15 | −1.19 | −1.26 | −1.78 | −1.12 | −1.10 | −1.05 | −0.33 |
| Difference in reduction potential (v) | −0.39 | −0.40 | −0.43 | −0.50 | −1.02 | −0.36 | −0.34 | −0.29 | +0.43 |
| Sensitivity (step number) | 6 | 10 | 2 | 7 | 8 | 4 | 11 | 4 | no image formed |

Trihalomethyl-s-triazine Compounds

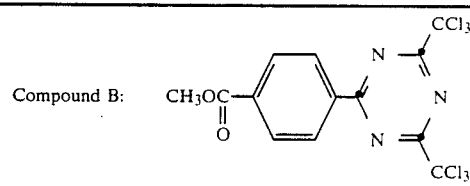

Compound A: 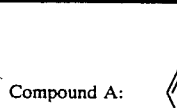

| Photosensitizers | | λmax |
|---|---|---|
| Compound a: | (structure) | 595 nm |
| Compound b: | (structure) | 460 nm |
| Compound c: | (structure) | 490 nm |
| Compound d: | (structure) | 504 nm |

TABLE 3-continued

Photopolymerizable compositions with Reduction Potentials and Results

| Compound e: | 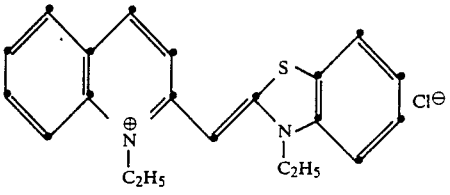 | 460 nm |
| Compound f: | 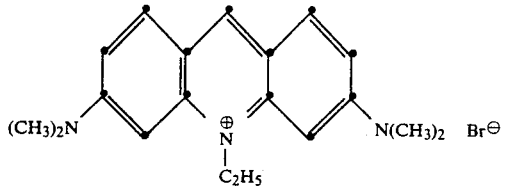 | 503 nm |
| Compound g: | 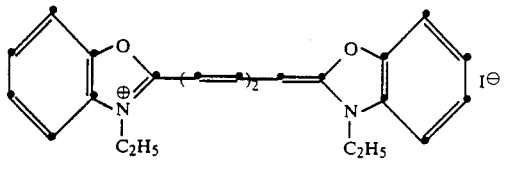 | 592 nm |
| Compound h: | 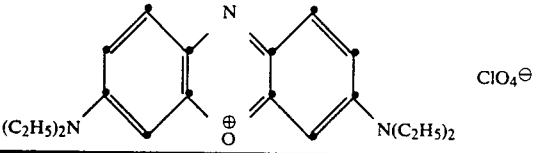 | 658 nm |

While the invention has been described in detail and with reference to specific examples thereof, it will be apparent to one skilled in the art that various changes and modifications can be made therein without departing from the spirit and scope thereof.

What is claimed is:

1. A photosensitive composition comprising a trihalomethyl-s-triazine compound and a photosensitizer, wherein the photosensitizer is selected from the group consisting of cyanine dyes containing an oxocarbon-bridged nucleus in the methine chain thereof, quaternized acridine dyes, and sulfonocoumarine dyes.

2. A photopolymerizable composition comprising a trihalomethyl-s-triazine compound, a photosensitizer, and a polymerizable compound having at least one ethylenically unsaturated group, wherein said photosensitizer is selected from the group consisting of cyanine dyes containing an oxocarbon-bridged nucleus in the methine chain thereof, quaternized acridine dyes, and sulfonocoumarine dyes.

3. The photosensitive composition as in claim 1, wherein said photosensitizer has a reduction potential not more than 0.10 volt higher than the reduction potential of said trihalomethyl-s-triazine compound.

4. The photopolymerizable composition as in claim 2, wherein the composition further comprising an organic linear high polymer which is soluble in water or a weakly alkaline aqueous solution.

5. The photopolymerizable composition as in claim 4, wherein the polymerizable compound having at least on ethylenically unsaturated group comprises from 10 to 99.5% by weight of the photopolymerizable composition.

6. The photopolymerizable composition as in claim 4, wherein the amount of the trihalomethyl-s-triazine compound contained in the photopolymerizable composition is in the range of from 0.01 to 60% by weight based on the total amount of the ethylenically unsaturated photopolymerizable compound and the organic linear high polymer present in the photopolymerizable composition.

7. The photopolymerizable composition as in claim 4, wherein the amount of the photosensitizer contained in the photopolymerizable composition is in the range of from 0.01 to 60% by weight based on the total amount of the ethylenically unsaturated photopolymerizable compound and the organic linear high polymer present in the photopolymerizable composition.

* * * * *